(12) United States Patent
Langmaid et al.

(10) Patent No.: US 9,537,033 B2
(45) Date of Patent: Jan. 3, 2017

(54) INTERFACE SYSTEM AND METHOD FOR PHOTOVOLTAIC CLADDING TO STANDARD CLADDING

(75) Inventors: Joseph A Langmaid, Caro, MI (US); James R Kennihan, Midland, MI (US); Leonardo C Lopez, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 44 days.

(21) Appl. No.: 14/234,211

(22) PCT Filed: Jul. 27, 2012

(86) PCT No.: PCT/US2012/048571
§ 371 (c)(1),
(2), (4) Date: Jan. 22, 2014

(87) PCT Pub. No.: WO2013/019628
PCT Pub. Date: Feb. 7, 2013

(65) Prior Publication Data
US 2015/0083197 A1    Mar. 26, 2015

Related U.S. Application Data

(60) Provisional application No. 61/513,268, filed on Jul. 29, 2011.

(51) Int. Cl.
*H01L 31/048* (2014.01)
*G06Q 30/02* (2012.01)
(Continued)

(52) U.S. Cl.
CPC .......... *H01L 31/048* (2013.01); *F24J 2/5245* (2013.01); *G06Q 30/02* (2013.01); *H02S 20/22* (2014.12);
(Continued)

(58) Field of Classification Search
CPC .......... H02S 20/26; H02S 20/00; H02S 20/22; H02S 20/23; H02S 20/24; H02S 20/25; F24J 2002/0061; F24J 2002/0053; F24J 2/52
See application file for complete search history.

(56) References Cited

U.S. PATENT DOCUMENTS 2,631,887 A    3/1953  Wernig
3,234,701 A *  2/1966  Burtch ........................... 52/419
(Continued)

FOREIGN PATENT DOCUMENTS

DE    102005061709 A    3/2007
EP        841706 A2      5/1998
(Continued)

OTHER PUBLICATIONS

InfoTech, "Structural Insulated Panel (SIP) Flashing Tape", Jul. 2005, Ashland Specialty Polymers & Adhesives, pp. 1-3.*
(Continued)

*Primary Examiner* — Devina Pillay
*Assistant Examiner* — Daniel Malley, Jr.
(74) *Attorney, Agent, or Firm* — The Dobrusin Law Firm, P.C.; Daniel P. Aleksynas

(57) ABSTRACT

The present invention is premised upon a system and method for an improved photovoltaic cladding device array with an interface member (500) for use on a building structure with other non-solar cladding materials (600). The interface member is disposed under a portion of the photovoltaic cladding elements (P) and includes a photovoltaic cladding element nesting portion and a building sheatin nesting portion.

16 Claims, 9 Drawing Sheets

(51) Int. Cl.
  *H02S 20/25*   (2014.01)
  *H02S 20/22*   (2014.01)
  *H02S 30/20*   (2014.01)
  *F24J 2/04*   (2006.01)
  *F24J 2/52*   (2006.01)

(52) U.S. Cl.
  CPC ............... *H02S 20/25* (2014.12); *H02S 30/20* (2014.12); *F24J 2/0455* (2013.01); *F24J 2002/5294* (2013.01); *Y02B 10/12* (2013.01); *Y02B 10/20* (2013.01); *Y02E 10/47* (2013.01); *Y04S 50/14* (2013.01)

(56) References Cited

U.S. PATENT DOCUMENTS

| | | | |
|---|---|---|---|
| 3,767,471 A | | 10/1973 | Kasper et al. |
| 4,465,575 A | | 8/1984 | Love et al. |
| 4,586,301 A | | 5/1986 | Hickman |
| 4,627,207 A | | 12/1986 | Young et al. |
| 4,641,471 A | | 2/1987 | Young et al. |
| 4,641,472 A | | 2/1987 | Young et al. |
| 4,652,321 A | * | 3/1987 | Greko ............ 156/165 |
| 4,686,808 A | | 8/1987 | Triplett |
| 5,239,802 A | | 8/1993 | Robinson |
| 5,950,387 A | | 9/1999 | Stahl et al. |
| 6,148,570 A | | 11/2000 | Dinwoodie et al. |
| 6,247,289 B1 | | 6/2001 | Karpinia |
| 6,397,556 B1 | | 6/2002 | Karpinia |
| 6,725,623 B1 | | 4/2004 | Riddell et al. |
| 6,758,019 B2 | | 7/2004 | Kalkanoglu et al. |
| 6,845,592 B2 | | 1/2005 | Voegele |
| RE38,988 E | | 2/2006 | Dinwoodie |
| 7,118,794 B2 | | 10/2006 | Kalkanoglu et al. |
| 7,178,295 B2 | | 2/2007 | Dinwoodie |
| 7,204,063 B2 | | 4/2007 | Kandalgaonkar |
| 7,299,598 B2 | | 11/2007 | Gembala et al. |
| 8,215,071 B2 | * | 7/2012 | Lenox ............ 52/173.3 |
| 2002/0066235 A1 | | 6/2002 | Stearns et al. |
| 2003/0154680 A1 | | 8/2003 | Dinwoodie |
| 2003/0188500 A1 | | 10/2003 | Voegele |
| 2004/0083673 A1 | | 5/2004 | Kalkanoglu et al. |
| 2004/0206035 A1 | | 10/2004 | Kandalgaonkar |
| 2004/0216405 A1 | | 11/2004 | Gembala et al. |
| 2005/0011550 A1 | | 1/2005 | Chittibabu et al. |
| 2005/0229924 A1 | | 10/2005 | Luconi et al. |
| 2007/0193135 A1 | | 8/2007 | Vandenberg |
| 2007/0199590 A1 | * | 8/2007 | Tanaka et al. ............ 136/251 |
| 2007/0256734 A1 | | 11/2007 | Guha et al. |
| 2007/0295391 A1 | | 12/2007 | Lenox et al. |
| 2008/0000173 A1 | | 1/2008 | Lenox et al. |
| 2008/0083169 A1 | | 4/2008 | Sicurella |
| 2008/0196231 A1 | | 8/2008 | Grove |
| 2008/0196358 A1 | | 8/2008 | Schafer-Roth |
| 2008/0245399 A1 | | 10/2008 | DeLiddo |
| 2008/0245404 A1 | | 10/2008 | DeLiddo |
| 2008/0302031 A1 | | 12/2008 | Bressler et al. |
| 2009/0000220 A1 | | 1/2009 | Lenox |
| 2010/0180523 A1 | | 7/2010 | Lena et al. |
| 2010/0242381 A1 | * | 9/2010 | Jenkins ............ H01L 31/0482 52/173.3 |
| 2011/0100436 A1 | * | 5/2011 | Cleereman ............ H01R 31/00 136/251 |
| 2012/0118349 A1 | | 5/2012 | Keenihan et al. |

FOREIGN PATENT DOCUMENTS

| | | |
|---|---|---|
| EP | 1032051 A2 | 8/2000 |
| EP | 1431476 A1 | 6/2004 |
| FR | 2 914 785 A1 | 10/2008 |
| JP | S56-169020 U | 12/1981 |
| JP | 2216874 A | 2/1989 |
| JP | 2143468 A | 6/1990 |
| JP | H05-003430 U | 1/1993 |
| JP | 2000-501469 A | 4/1998 |
| JP | 10189924 A | 7/1998 |
| JP | H10-212805 A | 8/1998 |
| JP | H10-231590 A | 9/1998 |
| JP | H11-303323 A | 11/1999 |
| JP | 2001/098703 A | 4/2001 |
| JP | 200198703 | 4/2001 |
| JP | 2001/227109 A | 8/2001 |
| JP | 2001/279871 A | 10/2001 |
| JP | 2003/147913 A | 5/2003 |
| JP | 2003-179246 A | 6/2003 |
| JP | 2007/243166 A | 9/2007 |
| WO | 00/30184 A1 | 5/2000 |
| WO | 03/071047 A2 | 8/2003 |
| WO | 2007/035677 A2 | 3/2007 |
| WO | 2007/079382 A2 | 7/2007 |
| WO | 2007/123927 A2 | 11/2007 |
| WO | 2008/063660 A | 5/2008 |
| WO | 2009/137347 A3 | 11/2009 |
| WO | 2009/137348 A3 | 11/2009 |
| WO | 2009/137352 A3 | 11/2009 |
| WO | 2009/137353 A3 | 11/2009 |
| WO | WO 2009137348 A2 * | 11/2009 ............ H01R 31/00 |

OTHER PUBLICATIONS

Written Opinion and Search Report for PCT /US2012/048571 mailed Nov. 2, 2012.
IPRP for PCT /US2012/048571 mailed Nov. 6, 2013.
The Patent Office of the People's Republic of China Office Action dated Mar. 2, 2016 for Application No. 201280037686.0.

* cited by examiner

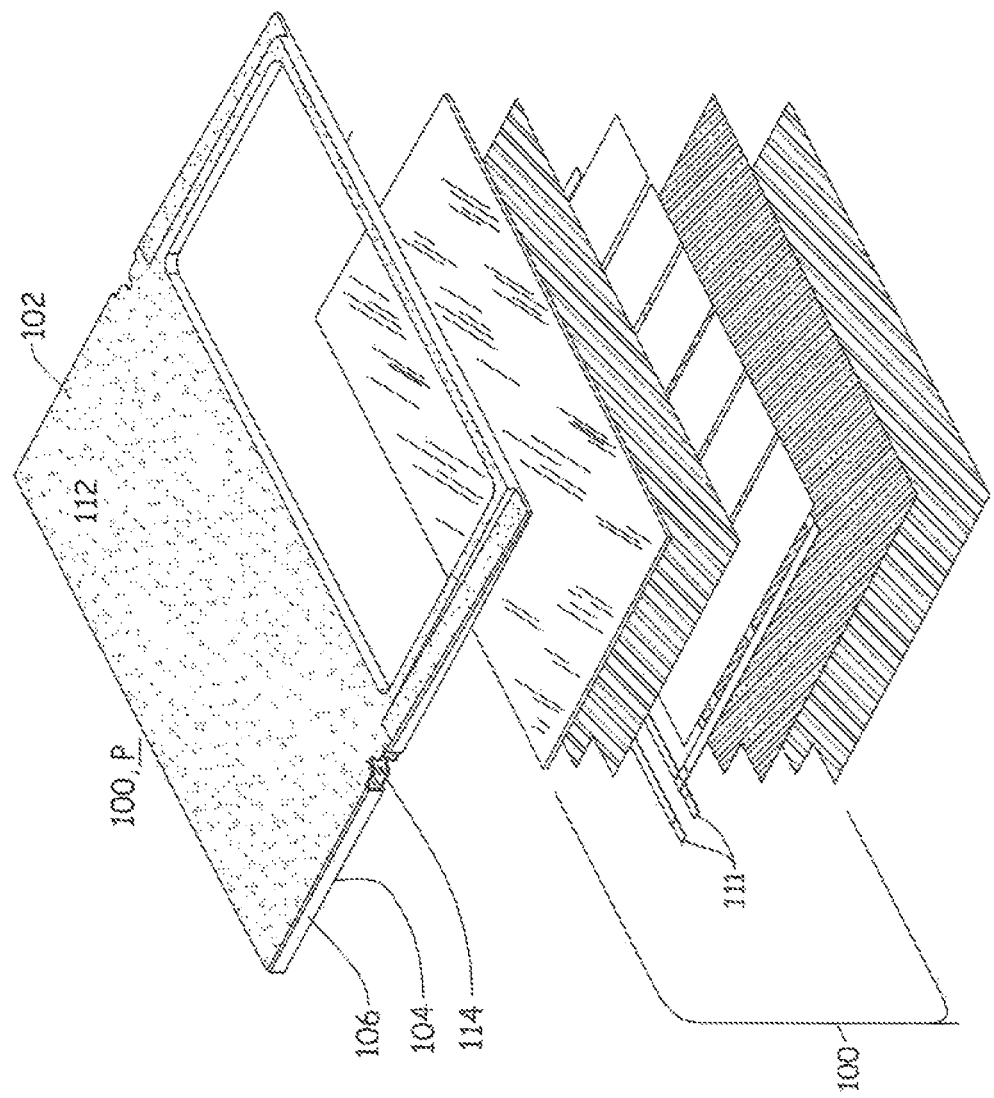

INTERFACE SYSTEM AND METHOD FOR PHOTOVOLTAIC CLADDING TO STANDARD CLADDING

CLAIM OF PRIORITY

This application is a national phase filing under 35 USC §371 from PCT Application serial number PCT/US2012/048571 filed on Jul. 27 2012, and claims priority therefrom. This application further claims priority from U.S. Provisional Application 61/513,268 filed Jul. 29, 2011, both incorporated herein by reference.

FIELD OF THE INVENTION

The present invention relates to a system and method for an improved photovoltaic cladding device array with an interface member for use on a building structure with other non-solar cladding materials.

BACKGROUND

Efforts to improve PV (photovoltaic) devices, particularly those devices that are integrated into building structures (e.g. photovoltaic sheathing elements, spacer pieces, edge pieces), to be used successfully, should satisfy a number of criteria. The PV devices may be commonly known as Building-integrated photovoltaics (BIPV). These BIPVs are typically PV devices (and associated system components) that are used to replace conventional building materials in parts of the building envelope such as the roof, skylights, or facades. The PV device and the array as installed should be durable (e.g. long lasting, sealed against moisture and other environmental conditions) and protected from mechanical abuse over the desired lifetime of the product, preferably at least 15 years, more preferably at least 25 years. The device should be easily installed into the array of devices (e.g. installation similar to conventional roofing shingles or exterior wall coverings) or replaced (e.g. if damaged).

BIPVs have increased in popularity significantly in areas that desire premium aesthetics. Having the photovoltaic material appear integral to the roof line presents challenges as it displaces the standard roofing materials which are of a very different material.

Most BIPVs sold today are designed to meet a performance warranty of at least 15 to 25 years and an expected service life beyond this. The life of the BIPVs appears to exceed the expected life of a traditional asphalt shingle (e.g. 10-16 years). When comparing the BIPVs to a premium roofing material such as concrete tile or natural state, the BIPV's life may be below that of the natural roof; suggesting the BIPVs will be replaced first.

These different life cycles may result in the different roofing materials being removed and replaced in different time intervals. If both materials are replaced together, the expense of the repair could include the cost of both. While one may believe it would be ideal if the photovoltaic material could cover the entire roof, this is unlikely due to building codes and roofing complexity. Therefore, standard roofing materials are used for safety (access areas, shaded areas, etc), ease of interface (around vent stacks, dormers, etc) and to reduce overall roofing cost.

This presents the problem of having two very different materials on the roof top at the same time, one material requiring standard roofing experience, the other requiring photovoltaic experience. This also may prevent maintenance on one or the other material without the other tradesman being present. To make this full package desirable to the consumer, and to gain wide acceptance in the marketplace, the system should be inexpensive to build and install. The present invention may help alleviate the problems discussed above and facilitate lower generated cost of energy, making PV technology more competitive relative to other means of generating electricity.

Among the literature that can pertain to this technology include the following patent documents: WO/2009/137353A3; WO/2009/137352A3; WO/2009/137348A3; and WO/2009/137347A3; all incorporated herein by reference for all purposes and particularly for teachings on photovoltaic roofing or building sheathing element, arrays, and connectors.

SUMMARY OF THE INVENTION

The present invention is directed to an improved photovoltaic roofing/cladding system and method for use on a building structure, more particularly for use with and interface with other non-solar cladding materials. The system and method herein seek to provide a unique solution to one or more of the problems and/or issues discussed in the previous section. Of particular interest is providing a system and method that aids in one's ability to install/remove/repair both photovoltaic cladding and/or traditional cladding without having to substantially affect the other.

Accordingly, pursuant to one aspect of the present invention, there is contemplated a photovoltaic device kit comprising: a. at least a plurality of PV sheathing elements, adapted to serve as an outer cladding of a structure, in one or more rows or columns as applied to the structure, the PV sheathing element including: i. a body portion including lower surface portion that directly or indirectly contacts the structure and an upper surface portion that receives one or more fasteners that attaches the photovoltaic device to the structure; b. one or more interface members as applied to the structure, disposed under a portion of the PV sheathing elements, the interface members including a PV sheathing element nesting portion and a building sheathing nesting portion.

The invention may be further characterized by one or any combination of the features described herein, such as the one or more interface members include an upper flashing portion adapted to cover a portion of a building sheathing member; the upper flashing portion comprises a flexible ledge portion disposed forward of the photovoltaic device nesting portion and above the building sheathing nesting portion; the one or more interface members comprise a flexible sheet that can be rolled out as applied to the structure; the upper flashing portion comprises a removable flashing member; one or more interface members include one or more photovoltaic device retention features; the retention features comprise a mechanical fastening device, an adhesive, or both; the upper flashing portion has a sufficient length to cover fasteners disposed on the sheathing member; the building sheathing nesting portion includes a lower lip adapted to receive a fastener that holds the sheathing member to the structure; further including one or more sheathing members; and further including one or more snow/ice guards.

Accordingly, pursuant to another aspect of the present invention, there is contemplated a method of constructing a photovoltaic device assembly on a surface of a structure, comprising the steps of: a. providing at least a plurality of PV sheathing elements, adapted to serve as an outer cladding of a structure, in one or more rows or columns as applied to the structure, the PV sheathing element including: i. a body portion including lower surface portion that directly or indirectly contacts the structure and an upper surface portion that receives one or more fasteners that attaches the photovoltaic device to the structure; b. providing one or more interface members as applied to the structure, disposed under a portion of the photovoltaic devices, the interface members including a photovoltaic device nesting portion and a building sheathing nesting portion; c. placing and attaching one or more interface members to the surface of the structure; d. placing a first individual photovoltaic device on to the one or more interface members in the photovoltaic device nesting portion: e. attaching a first individual photovoltaic device to the one or more interface members and to the structure; f. repeat steps c-e or d-e until a first row of photovoltaic devices is attached to the surface; and optionally including the steps of providing a sheathing member, placing the sheathing member into the building sheathing nesting portion, and attaching the sheathing member to the structure.

DESCRIPTION OF THE DRAWINGS

FIGS. 1-11 relate to the disclosed invention.

DETAILED DESCRIPTION OF THE PREFERRED EMBODIMENT

Figure 1:
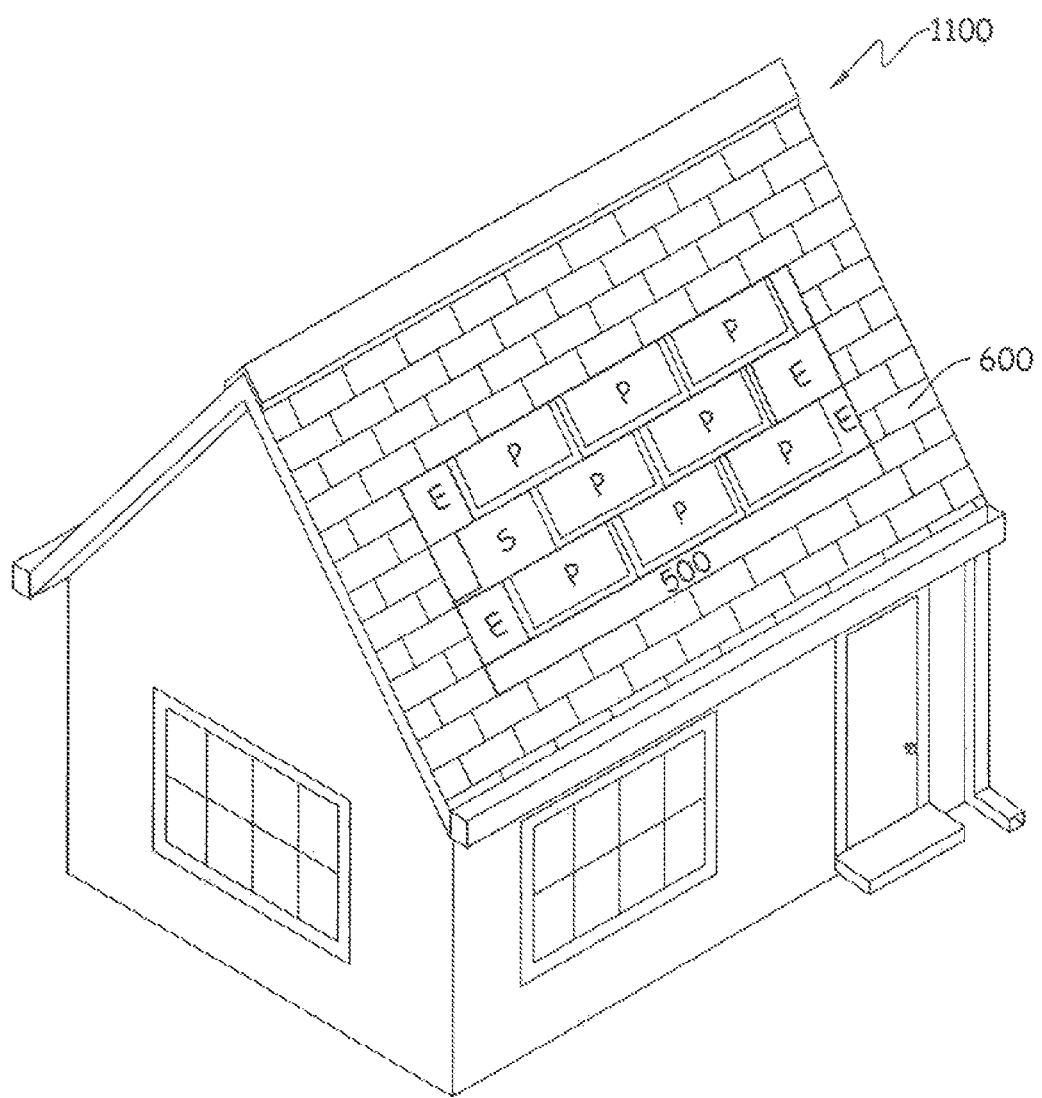

Simply stated, the present invention is an improved photovoltaic roofing/cladding system and method for use on a building structure 1100 with other non-solar cladding materials. The photovoltaic roofing/cladding system (e.g. array of devices 1000) at least utilizes interface members 500 in conjunction with PV devices 100 ("P", "E", and potentially "S"), for example as shown in FIG. 1, to potentially allow for installation/repair/replacement of any of the cladding materials without necessarily affecting one another. Each component of the system may be described in further detail in the following paragraphs, in the drawings, or in the other patent applications that are incorporated by reference herein for the purposes stated.

It should be appreciated that the above and below referenced aspects and examples are non-limiting, as others exist within the present invention, as shown and described herein. Photovoltaic Roofing or Building Sheathing Element/Device 100

It is contemplated that the PV sheathing device 100 may be a PV device "P", or spacer device "S", or edge pieces "E", for example as described and disclosed in PCT publication 2009/137353 and corresponding U.S. patent application Ser. No. 12/989,743, incorporated herein by reference for the teachings of the structure of the photovoltaic device and the filler piece (AKA spacer devices "S").

A PV device "P" functions as an electrical generating device that includes a functional element such as a photovoltaic cell assembly 111 within its structure. One illustrative example of a PV device "P" may be seen in FIG. 2, where an exploded view of a device "P" is shown. This illustrative example shows a device "P" that is constructed of a multilayered laminate 110 that is surrounded (e.g. via over-molding) by a body portion 112.

An edge piece "E" generally functions to connect multiple rows of devices together, and may or may not include other functional elements. The edge piece "E" also may serve as an interface between the side of the array 1000 and any adjoining materials (e.g. standard roofing/sheathing materials). A spacer device "S" generally may function to connect devices within a row, and may or may not include other functional elements.

The device 100, whether in the form of a PV device "P", a spacer device "S", or edge pieces "E", can be further defined as having a top surface 102, a bottom surface 104 and a peripheral edge 106 spanning therebetween. It is also contemplated that the device 100 has an electrical connector (e.g. sheathing device electrical connector 114) disposed on or about the peripheral edge 106 that provides the junction for electrical energy produced by the device (or the array). In a preferred embodiment, the peripheral edge 106 is no more than about 35 mm in thickness, more preferably no more than about 25 mm, most preferably about 20 mm, and no thinner that about 5 mm, more preferably no thinner than about 10 mm, and most preferably no thinner than about 15 mm. It is contemplated that in certain areas, for example on an edge piece "E", where standard roofing/sheathing materials may be overlaid, the peripheral edge 106 may be as thin as 0.5 mm.

It is preferred that the devices 100 are constructed primarily of a polymer (not including any functional elements such as the photovoltaic cells), although metallic materials are possible. Preferred materials or combinations of materials include a filled or unfilled moldable plastic (e.g. polyolefins, acrylonitrile butadiene styrene, hydrogenated styrene butadiene rubbers, polyester amides, polysulfone, acetel, acrylic, polyvinyl chloride, nylon, polyethylene terephthalate, polycarbonate, thermoplastic and thermoset polyurethanes, synthetic and natural rubbers, epoxies, styrene-acrylonitrile ("SAN"), polymethyl methacrylate, polystyrene, or any combination thereof). Fillers can include one or more of the following: colorants, fire retardant ("FR") or ignition resistant ("IR") materials, reinforcing materials, such as glass or mineral fibers, mineral fillers, such as talc, calcium carbonate or mica, or surface modifiers. Plastic can also include anti-oxidants, release agents, blowing agents, and other common plastic additives.

The photovoltaic cell assembly 111 may comprise photovoltaic cells that are constructed of any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium solenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula $CuIn(1-x)Ga_xSe(2-y)S_y$ where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. Those cells may be flexible or rigid and come in a variety of shapes and sizes, but generally are fragile and subject to environmental degradation. In a preferred embodiment, the photovoltaic cell assembly 111 is a cell that can bend without substantial cracking and/or without significant loss of functionality. Exemplary photovoltaic cells are taught and described in a number of US patents and publications, including U.S. Pat. Nos. 3,767,471, 4,465,575, US20050011550 A1, EP841706 A2, US20070256734 a1,. EP1032051A2, JP2216874, JP2143468, and JP10189924a, incorporated hereto by reference for all purposes.

Array of Devices/Elements 1000

Figure 3A:
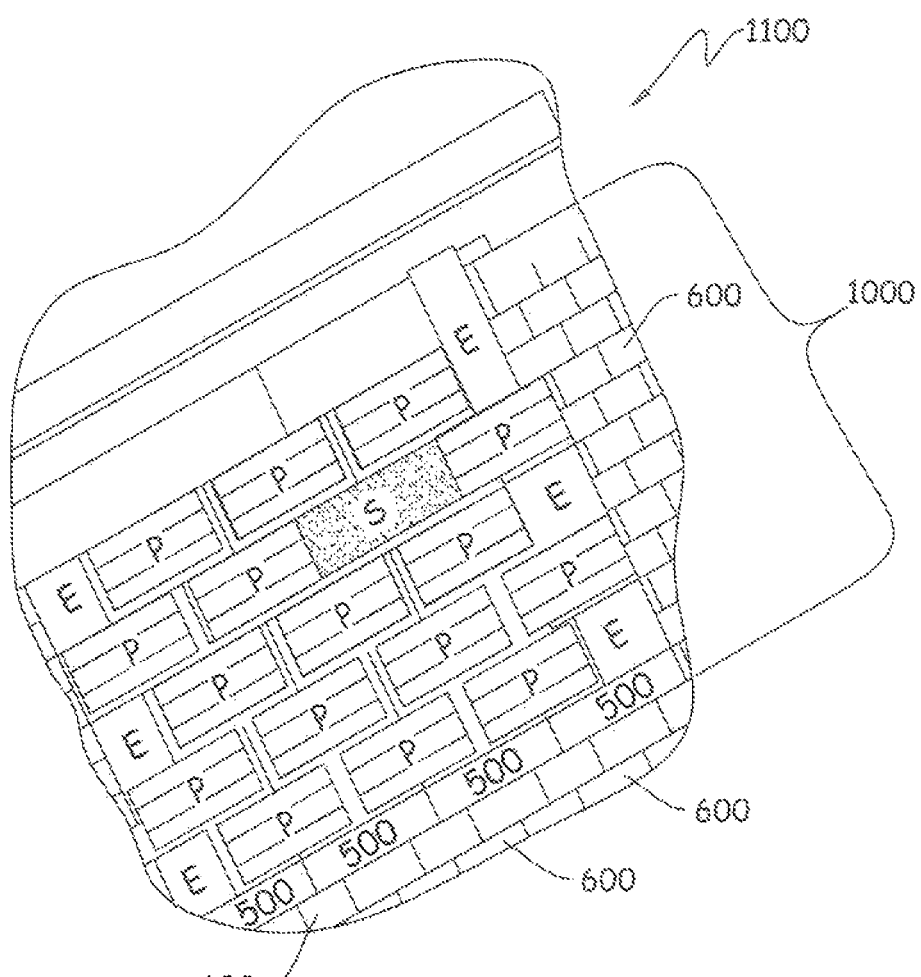

An array of devices (e.g. PV device "P", spacer devices "S", edge pieces "E", etc.) function to provide electrical energy when subjected to solar radiation (e.g. sunlight). An array is a collection of interconnected devices as installed on a building structure 1100. For the purposes of this invention, it is contemplated that the array 1000 is installed directly on an existing roof structure (or exterior surface) of a building structure 1100, over a roofing underlayment material (felt, self-adhered water barrier, fire-retardant layer, or moisture barrier sheet), or over a previously installed roofing material (e.g. asphalt shingles), in the same way traditional roofing elements are applied (unless otherwise noted herein). In a preferred embodiment, these arrays 1000 may be made up of two or more rows of adjoining devices, the rows containing at least two or more devices themselves. One or more interface members 500, described in more detail below, may be disposed on the bottom of the array 1000. As an illustrative example, at least partially shown in FIG. 3A, the array 1000 presented has 6 rows, multiple devices per row including an edge piece on each end and one exemplary illustration of interface members 500 making up the bottom row of the array (row 6). The focus of this invention is how an interface member or members 500 may help resolve one or more of the problems discussed in this application.

Interface Members 500

An interface member 500 functions to provide an interface row between the PV sheathing devices 100 and any non-PV sheathing device cladding materials (e.g. traditional asphalt shingles, premium roofing material such as concrete tile or natural slate, or similar components, herein referred to as a "sheathing member" 600). The member or members 500 may provide a nesting portion for both the PV sheathing devices 100 and for the sheathing member 600. It is contemplated that the member may allow for the installation/removal of devices 100 and/or members 600 independently of each other and in any order.

Figure 3B:
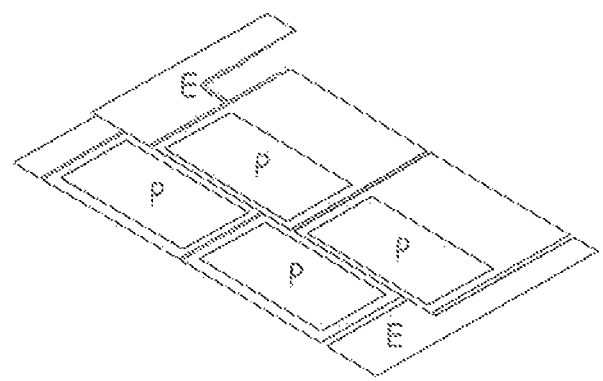
Figure 3C:
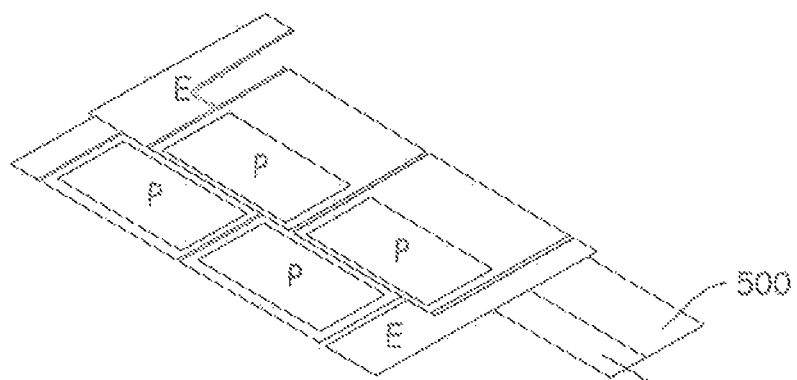
Figure 3D:
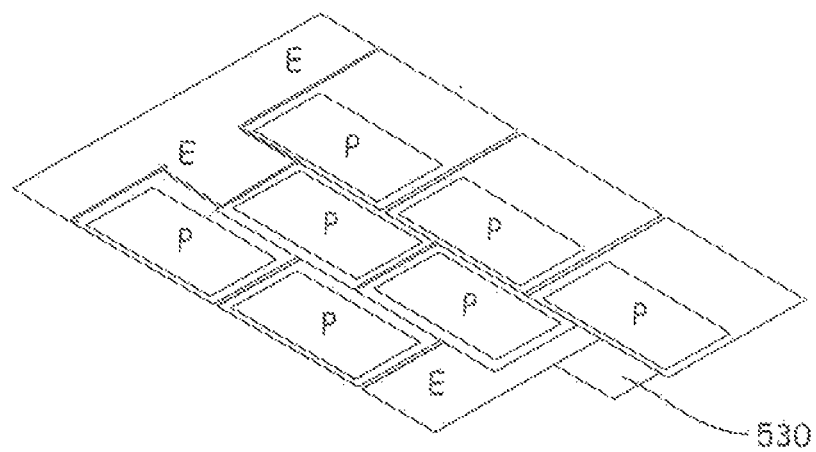
Figure 4:
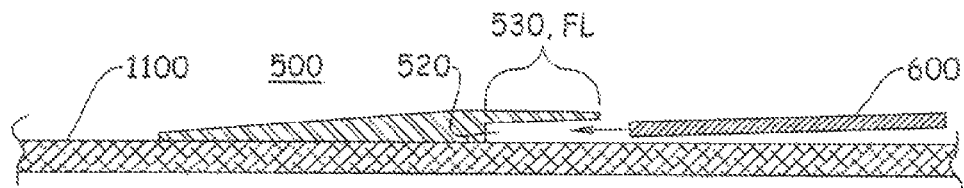
Figure 5A:
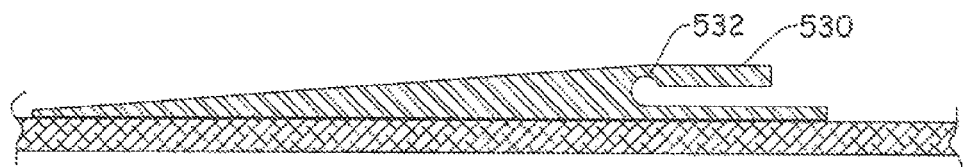
Figure 5B:
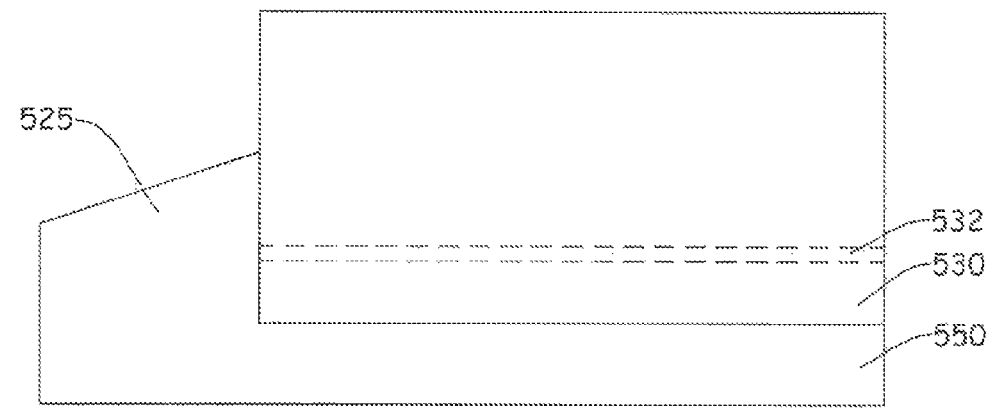
Figure 5C:
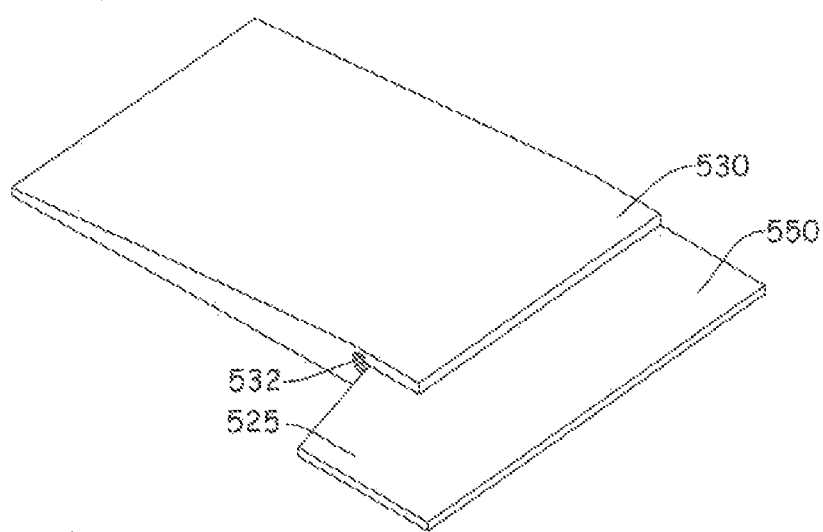

It is contemplated that the interface member 500 may at least be a three dimensional component that includes a PV sheathing element nesting portion 510 and a building sheathing nesting portion 520. Exemplary embodiments and variations are discussed in detail below. The PV sheathing element nesting portion 510 functions as a receiving area for the devices 100, wherein typically the device sits on top of the nesting portion in the installed position. It is contemplated that the nesting portion may include positioning features that aid in locating the devices. The building sheathing nesting portion 520 functions as at least receiving area for the sheathing members 600, wherein the member 600 at least abuts the nesting portion, for example as shown in FIG. 4. It is also contemplated that the member 500 may include horizontal overlap portions 525, for example as shown in FIGS. 5A, B and C, which function to provide an interface/overlap area between the side of the member and horizontally adjoining sheathing members 600. FIGS. 5A, B and C also show a living hinge 532 for the member 500, a nesting portion 520, an integral upper flashing portion 530, a lower flashing portion 550 and a horizontal overlap portion 525. FIG. 5A is a side view. 5B is a view with dotted lines showing the location of the living hinge 532 not visible from this perspective. 5C is a perspective view where the side of the living hinge 532 is shown and the unseen path of the living hinge is shown by dotted lines. It is also contemplated that the member 500 may have a unique geometry when it is made to be used at or near the end of a row (e.g. in conjunction with device "E", an edge piece), for example as shown in FIGS. 3B-D.

It is contemplated that the interface member 500 may be in the form of a discrete component (e.g. a panel-like member akin to devices 100) or may be in a continuous roll form, for example as shown in FIGS. 4 and 6 respectively.

In a preferred embodiment, the member 500 is constructed essentially of a polymeric material. Preferred materials or combinations of materials include a filled or unfilled moldable plastic (e.g. polyolefins, acrylonitrile butadiene styrene, hydrogenated styrene butadiene rubbers, polyesters, polyamides, polyester amides, polysulfone, acetal, acrylic, polyvinyl chloride, nylon, polyethylene terephthatate, polycarbonate, thermoplastic and thermoset polyurethanes, synthetic and natural rubbers, epoxies, styrene-acrylonitrile ("SAN"), polymethyl methacrylate, polystyrene, or any combination thereof). Fillers can include one or more of the following: colorants, fire retardant ("FR") or ignition resistant ("IR") materials, reinforcing materials, such as glass or mineral fibers, mineral fillers, such as talc, calcium carbonate or mica, or surface modifiers. Plastic can also include anti-oxidants, release agents, blowing agents, and other common plastic additives.

Figure 6A:
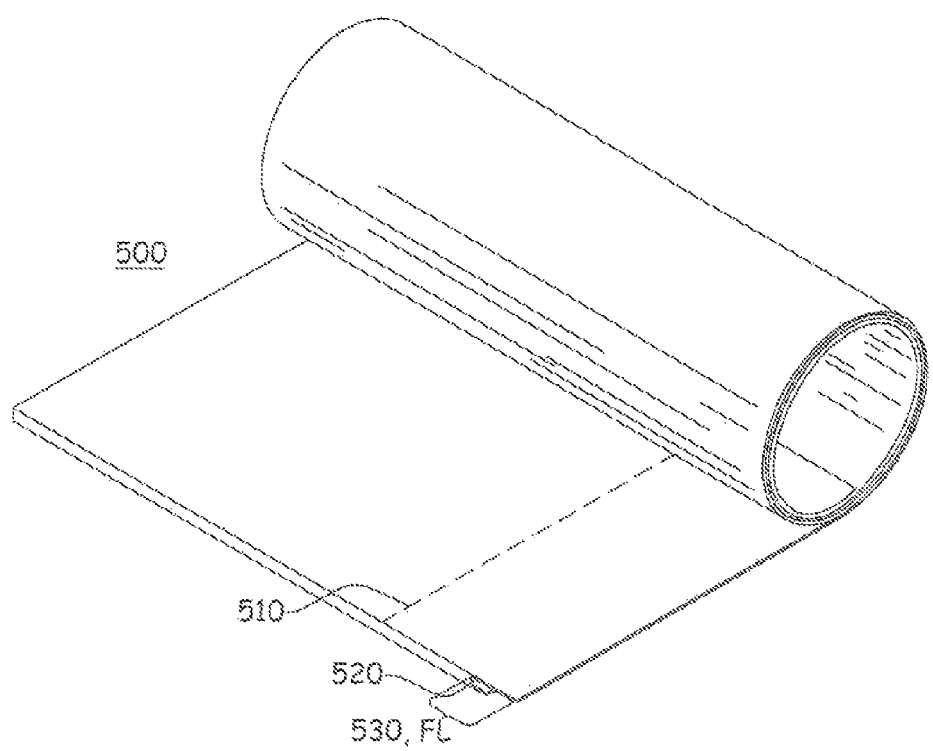
Figure 6B:
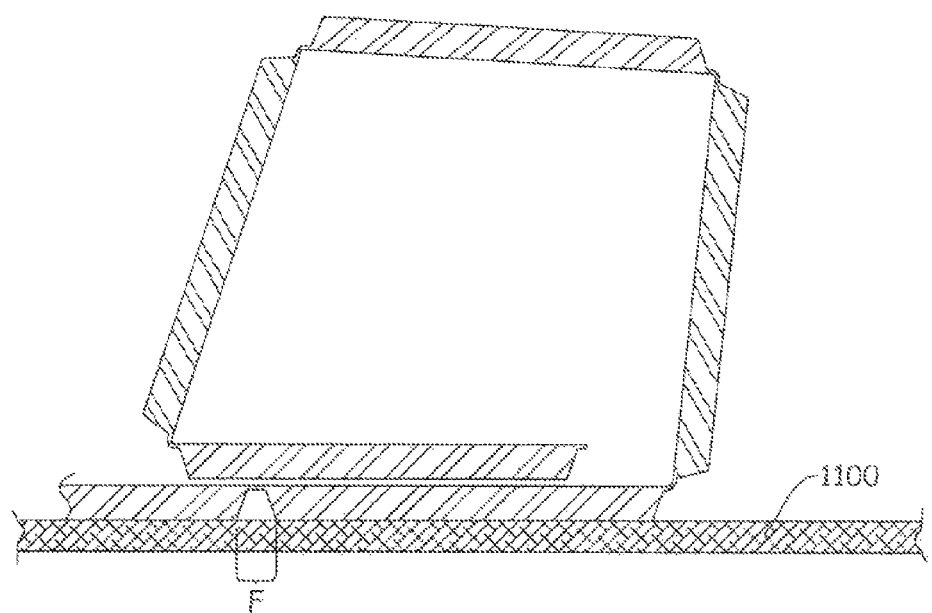
Figure 6C:
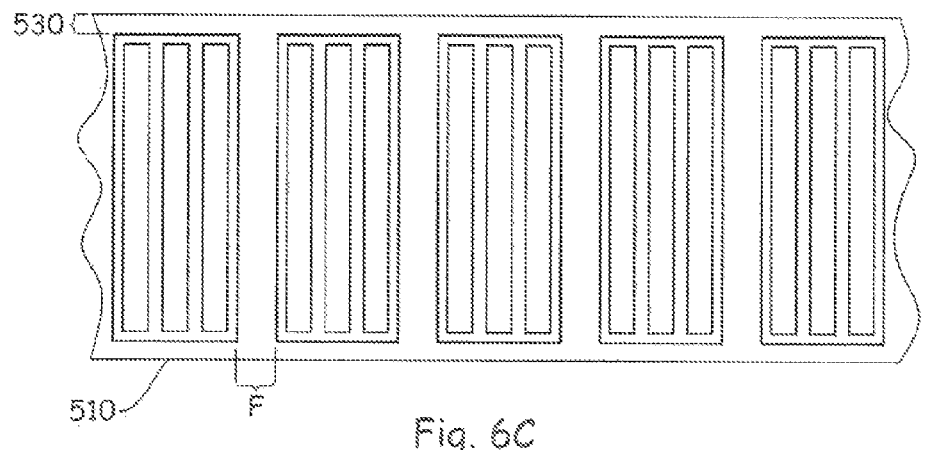

In the case where the member 500 is in a continuous roll form, for example as shown in FIGS. 6A-C, the preferred materials include: Polyolefins; hydrogenated styrene butadiene rubber; polyesters; polyamides: polyesteramides; poly (vinyl chloride); synthetic and natural rubbers; EPDM; and asphalt type compounds (i.e., shingle like material). A preferred embodiment can also be further defined as wherein X=(thickness in mm)^2/(ultimate strain in percent), X is about 200 or less, more preferably about 50 or less, most preferably about 10 or less and/or wherein Y=(Modulus of elasticity in MPa* thickness in mm), Y is less than about 20,000, more preferably about 4,000 or less, most preferably about 1,000 or less. Alternately, much higher ratios may be used when the thickness of the roll-out material is not uniform, for example as shown in FIGS. 6B-C, by having localized thin regions (region "F"). The materials may also include anti-oxidants, release agents, blowing agents, and other common additives used in plastic materials.

In a first embodiment, for example as shown in FIGS. 4 and 6, the member 500 may also include an integral upper flashing portion 530. The integral upper flashing portion 530 functions to cover a portion of the sheathing member 600, preferably covering at least down to and past the area which the sheathing member is secured to the building structure (e.g. where it is nailed to the roof). The portion 530 may be part of or separate to the building sheathing nesting portion 520. In a preferred embodiment, the integral upper flashing portion 530 is sufficiently flexible to allow the installation/removal of sheathing members 600 underneath it when installed on the building structure. It is contemplated that this "flexibility" may be obtained in any number of ways, including but not limited to: selecting a flexible material, adding geometric features such as a living hinge 532, or both. In a preferred embodiment, the upper flashing has a length (FL) of about 10 mm or greater, more preferably about 50 mm or greater, and most preferably about 100 mm or greater. This length is functionally so as to cover fasteners and/or edge tolerances on roofing material that is covered by the upper flashing 530.

Figure 7A:
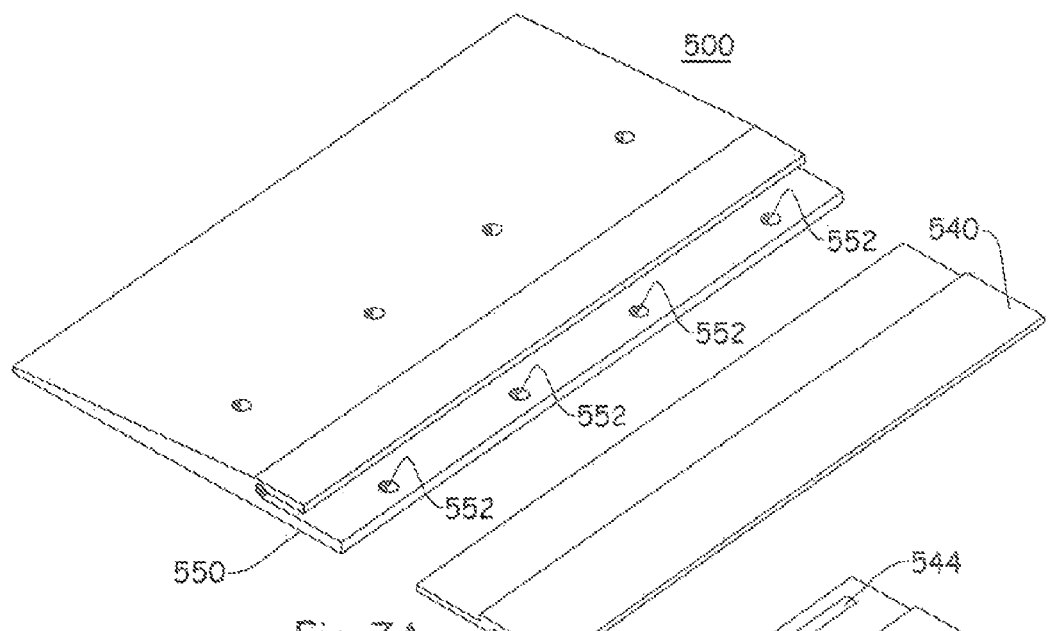
Figure 7B:
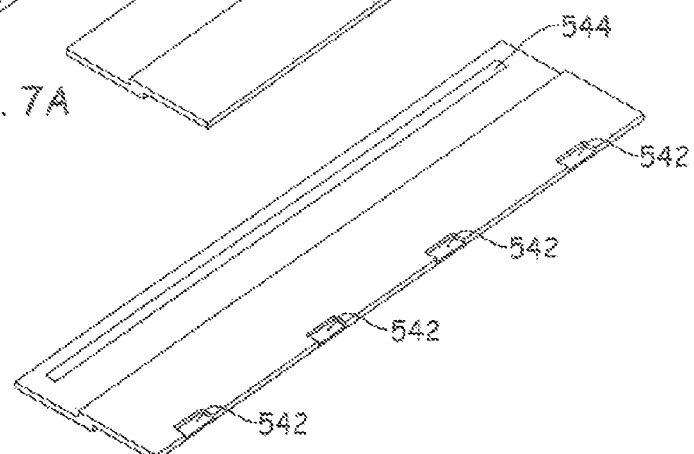

In a second embodiment, for example as shown in FIG. 7, the member may also include a removable upper flashing portion 540 (e.g. a two piece system). The removable upper flashing portion 540 functions to cover a portion of the sheathing member 600, preferably covering at least down to and past the area which the sheathing member is secured to the building structure (e.g. where it is nailed to the roof). The portion 540 may be part of or separate to the building sheathing nesting portion 520. In a preferred embodiment, the portion 540 may include retention features 542 that allow this removable piece to be secured to the interface member 500. It is contemplated that the retention features may be in the form of snaps, hooks, hook/loop fasteners, adhesives, or by any means appropriate to enable the desired function. It is contemplated that appropriate mating features are disposed in the interface member. One example may be seen in FIG. 7. It is also contemplated that it may be desirable to include an additional securing mechanism at or near (e.g. within about 25 mm) to the bottom edge of the portion 540. As illustrated in FIG. 7 in the middle section, in one preferred method, a zone of adhesive 544 may be utilized to provide the additional securing mechanism (see below in the fifth embodiment for preferred adhesives that may be utilized).

Figure 9:
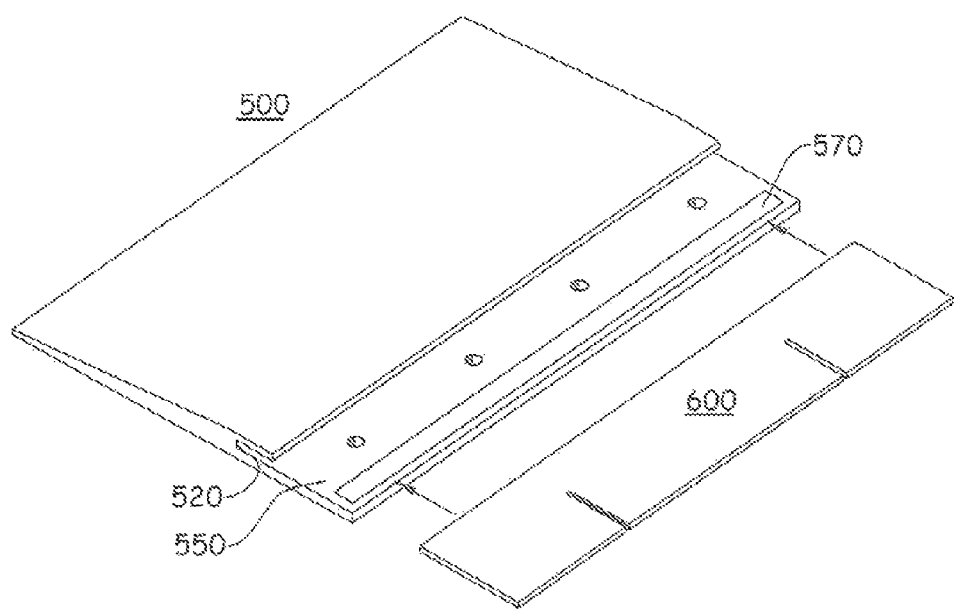
Figure 10:
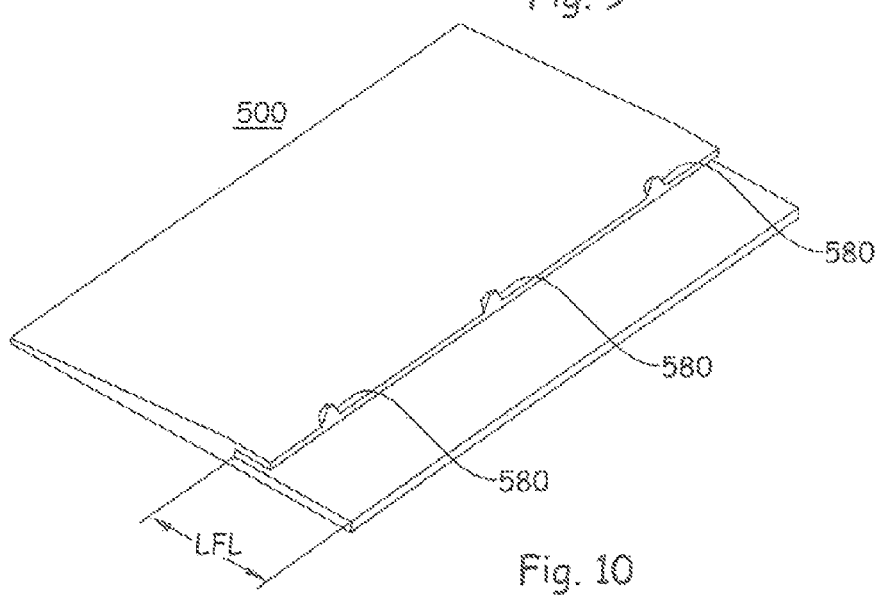

In a third embodiment, for example as shown in FIG. 7, the interface member 500 may include a lower flashing portion 550, generally in conjunction with the building sheathing nesting portion 520. This lower flashing functions to provide an additional barrier between the building structure and the sheathing member 600 and also may provide for additional securing areas for the interface member 500. As illustrated in FIGS. 7, 8, and 9 the lower flashing portion 550 may include fastener holes 552 (e.g. for receiving fasteners, such as nails or screws) and retention features 554 adapted to mate with corresponding retention features 542 of an upper flashing portion 540. It is also contemplated that the lower flashing portion 550 has a relatively small thickness. Preferably it has a thickness of about 15 mm or less. In one preferred embodiment, the thickness may be is about 0.01 mm or greater, more preferably about 1.5 mm or greater, and most preferably is about 3.0 mm or greater, and the thickness is about 15.0 mm or less, more preferably about 10.0 mm or less, and most preferably at most about 5.0 mm or less. It is also contemplated that the lower flashing portion 550 have a certain length (LFL, as best shown in FIG. 10). In one preferred embodiment, the length may be is at about 10 mm or greater, more preferably about 15 mm or greater, and most preferably is about 25 mm or greater, and the length is about 500 mm or less, more preferably about 350 mm or less, and most preferably about 200 mm or less.

Figure 8A:
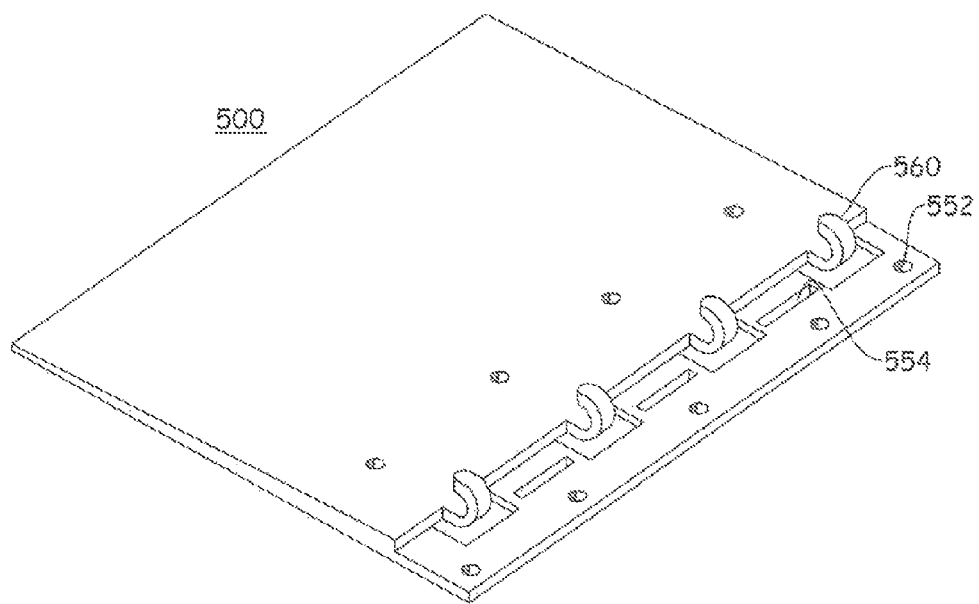
Figure 8B:
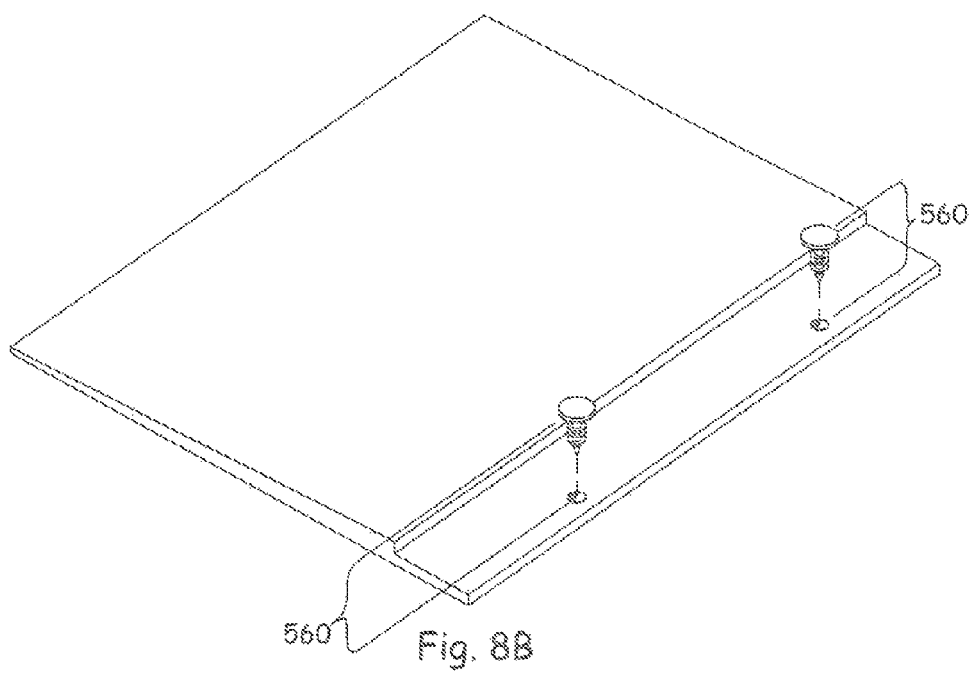

In a fourth embodiment, for example as shown in FIGS. 8A-B, the interface member 500 may include one or more PV device retention features 560. These features 560 may function to aid in the securing of and hold-down strength of the PV devices 100, particularly against the forces of wind up-lift (e.g. winds hitting the devices 100 normal to the forward edge at speeds of about 50 Km/hr or more). It is contemplated that those features 560 can be simple holes or depressions in the interface member 500 that is adapted to receive separate fasteners (e.g. clips as shown in FIG. 8B), can be integrally formed fasteners (e.g. hook-like structures as shown in FIG. 8A), can be secondary components, or can be a zone of adhesive that may be disposed on the member (preferably a pressure sensitive adhesive).

In a fifth embodiment, for example as shown in FIG. 9, the interface member 500 may include one or more sheathing member retention features 570. It may be preferred that any retention feature used in this area should not create additional holes in the building structure and have a relatively thin profile or thickness (e.g. about 0.01 mm to 4 mm). In the most preferred embodiment of the sheathing member retention features 570, a zone of adhesive is provided between the lower flashing portion 550 and the element 600 that provides the feature 570.

In general, it is preferred that the retention features 570 comprises a adhesive that maintains a minimum peel force of about 3 PLI (pounds per linear inch), more preferably about 5 PLI, and most preferred about 10 PLI or more, per ASTM D 903-98 at temperatures between about −40° C. and about 85° C. and have an elongation of about 500% or greater, more preferably about 1000% or greater per ASTM D 412-06. It is also preferred if the adhesive maintains a thickness (after assembly) of about 0.5 mm or more, more preferably from about 0.7 mm to about 2.0 mm.

In one preferred embodiment, the retention feature 570 is comprised of a pressure sensitive adhesive (PSA) or a contact adhesive, that bonds to surfaces on contact (no curing time required) and to the respective surfaces (e.g. adjoining device 10, or structure or an asphalt shingle) with very slight pressure. They may be available in solvent and latex or water based forms. It is believed that pressure sensitive adhesives and contact adhesives are often based on non-crosslinked rubber adhesives, acrylics or polyurethanes. It is also believed that pressure sensitive adhesives form viscoelastic bonds that are aggressively and permanently tacky; adhere without the need of more than a finger or hand pressure; and require no activation by water, solvent or heat.

Pressure sensitive adhesives and contact adhesives may be available in a wide variety of chemical compositions or systems. Some contemplated PSAs include acrylic and methacrylate adhesives, rubber-based pressure sensitive adhesives, alkadiene styrene copolymers (SIS/SBS) and hydrogenated versions thereof, and silicones. Acrylic adhesives are known for excellent environmental resistance and fast-setting time when compared with other resin systems. Acrylic pressure sensitive adhesives often use an acrylate system. Ethylene ethyl acrylate (EEA) or ethylene methyl acrylate (EMA) copolymers are used to form hot melt PSA adhesives. Natural rubber, synthetic rubber or elastomer sealants and adhesives can be based on a variety of systems such silicone, polyurethane, chloroprene, butyl, polybutadiene, isoprene or neoprene. In a preferred embodiment, the PSA include Ethylene Propylene Copolymer Tape, rubber based adhesives, synthetic rubber-based tape, PE foam tape, and acrylic based and or combination of the above in multi layer construction, e.g., Acrylic/PET/Acrytic. The most preferred adhesive being a butyl adhesive tape. It is contemplated that some important characteristics of the adhesive include adhesives with instant aggressive adhesion/tack to the roofing structure without the use of secondary materials such as primers, yet also has and retains high strength at and after weather extremes (such as elevated temperatures, e.g., 85° C., for prolonged periods, and provides watertight attachment of components to roofing structure. Some examples of commercially available (and trademarked) adhesives may include: Butyl, Ashland Plioseal Seam tape, Adco PVA series (e.g., PVA 600BT and 650BT); Rubber based Adco SP-505 Cured Roofing Seam Tape; Synthetic rubber based: MACtac TM1039 and GS series; Ethylene propylene copolymer: SikaLastomer 68; Acrylic/PET/Acrylic; and Tesa Tape 4965 PET reinforced; and PE Foam Tape; Tesa Tape 62932 D/C Foam Tape.

Figure 11:
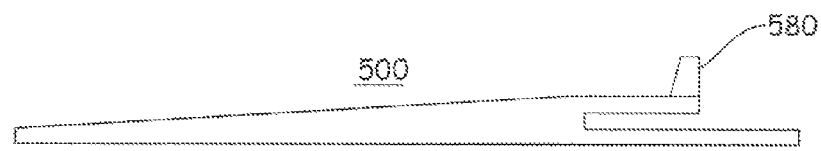

In a sixth embodiment, for example as shown in FIGS. 10 and 11, the interface member 500 may include one or more features that function as a snow/ice guard 580. Such guards 580 function to aid in preventing relatively large snow and/or ice sheets from sliding off of the array 1000, either entirely sliding off or at least as a large sheet (e.g. breaking up the sheet as it moves past the guard 580), or may be a heating element that prevents the formation of the snow/ice on the member 500. It is contemplated that in one embodiment, the guard 580 may be a simple projection that projects above the plane of the device 100 and is capable of holding back snow/ice sheets or can aid in the break-up of the sheets as they slide past the member 500. In one preferred configuration, as shown in FIG. 10, the guard 580 is a wedge shaped projection that is configured to split any snow/ice sheets that move past it. In another preferred configuration, the guard 580 comprises resistive heating elements that are disposed within or on the surface of the member 500 and help to maintain the surface temperature of the member (at least in localized areas) above freezing.

Method

It is contemplated in the present invention that the installation method provide herein is unique and aids in resolving one or more of the issues identified earlier in the application. It is contemplated that the array of devices 1000 may be installed before or after the installation of the other sheathing members 600 and vice versa, all because of the use of the interface members 500. It is contemplated that the interface member, at least in some embodiments, can be installed after the sheathing members 600 are installed.

It is contemplated that method of constructing a photovoltaic device assembly on a surface of a structure 1100, may comprise the steps of: a. providing a plurality of individual photovoltaic devices 100, wherein the individual photovoltaic devices include: i. a body portion including lower surface portion that contacts the structure, and an upper surface portion that receives a fastener (one or more) that attaches the photovoltaic device to the structure; b. providing one or more interface members as applied to the structure, disposed under a portion of the photovoltaic devices, the interface members including a photovoltaic device nesting portion and a building sheathing nesting portion; c. placing and attaching one or more interface members to the surface; d. placing a first individual photovoltaic device on to the one or more interface members in the photovoltaic device nesting portion; e. attaching a first individual photovoltaic device to the one or more interface members and to the structure; f. repeat steps c-e until a first row of photovoltaic devices is attached to the surface.

It is also contemplated that the steps of providing a sheathing member, placing the sheathing member into the building sheathing nesting portion, and attaching the sheathing member to the structure may be included in the inventive method. These steps may come anywhere after step "c". Also, as stated before, the interface member, at least in some embodiments, can be installed after the sheathing members 600 are installed. It is also contemplated that step "c" may only have to be completed one time, for example in the case of a rolled out interface member (e.g. see FIG. 6) or if more than one interface member is installed before any other components are installed.

It is contemplated and expressly stated herein that the embodiments or examples described above may not be mutually exclusive and may be used in combination with each other.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features or other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68; 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" describing combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A method of constructing a building-integrated photovoltaic device assembly on a surface of a structure, comprising the steps of:
   a. providing a plurality of photovoltaic (PV) sheathing elements, adapted to serve as an outer cladding of a structure, in one or more rows or columns as applied to the structure so that the plurality of photovoltaic sheathing elements when attached together form the building-integrated photovoltaic device assembly, which includes a bottom edge, and each of the PV sheathing elements including:
      i. a body portion including:
         1. a lower surface portion that directly contacts the structure and
         2. an upper surface portion that receives one or more fasteners that attaches each of the PV sheathing elements to the structure;
   b. providing one or more interface members as applied to the structure, disposed under a portion of the bottom edge of the building-integrated photovoltaic device assembly, the one or more interface members including:
      1. an photovoltaic device nesting portion,
      2. a building sheathing nesting portion, and
      3. one or more photovoltaic device retention features;
   c. placing and attaching the one or more interface members directly to the surface so that the one or more interface members form an interface row between the bottom edge of the building-integrated photovoltaic device assembly and a row of sheathing members;
   d. placing a first individual PV sheathing element of the plurality of PV sheathing elements in the first row of the PV sheathing elements on to the one or more interface members in the photovoltaic device nesting portion;
   e. attaching the first individual PV sheathing element to the one or more interface members with the one or more photovoltaic device retention features, and attaching the first individual PV sheathing element to the structure with one or more fasteners that extend through the upper surface portion;
   f. repeating steps c-e or d-e until the first row or the first column of PV sheathing elements are attached to the surface; and
   g. attaching a plurality of individual PV sheathing element in a second row and creating an overlap by placing the second row so that the second row covers a portion of each of the individual PV sheathing elements in the first row; and
   wherein the one or more retention features are a plurality of retention features that each have a generally "C" shaped hook structure.

2. The method according to claim 1, including the steps of providing the sheathing members, placing the sheathing member into the building sheathing nesting portion, and attaching the sheathing members to the structure.

3. The method according to claim 1, wherein the one or more interface members include an upper flashing portion that covers a portion of a building sheathing member and the upper flashing portion comprises a flexible ledge portion disposed forward of the photovoltaic device nesting portion and above the building sheathing nesting portion.

4. The method according to claim 1, wherein the one or more interface members comprise a flexible sheet that can be rolled out as applied to the structure.

5. The method according to claim 3, wherein the upper flashing portion comprises a removable flashing member.

6. The method according to claim 1, wherein the one or more interface members include an upper flashing portion and a lower flashing portion that are two discrete pieces, and the one or more photovoltaic device retention features are located on the upper flashing portion and the lower flashing portion and the retention features on the lower flashing portion are adapted to mate with the retention features of the upper flashing portion.

7. The method according to claim 1, wherein the interface members include one or more features that are a snow guard, an ice guard, or both.

8. The method according to claim 1, wherein the retention features comprise a mechanical fastening device, an adhesive, or both that connect the PV sheathing elements to the one or more interface members.

9. The method according to claim 6, wherein the retention features comprise a mechanical fastening device, an adhesive, or both that connect the PV sheathing elements to the one or more interface members.

10. The method according claim 3, wherein the upper flashing portion has a sufficient length to cover fasteners disposed on the sheathing member.

11. The method according to claim 1, wherein the one or more interface members include a second set of retention features that are located between each of the generally "C" shaped hook structures.

12. The method according to claim 1, wherein the one or more retention features are located at a forward edge of the one or more interface members so that the one or more retention features are located at the bottom edge of the building-integrated photovoltaic device assembly and assist in holding down a bottom edge of each of the PV sheathing elements against forces of wind up-lift.

13. The method according to claim 1, wherein the one or more photovoltaic retention features connect to the PV sheathing elements without creating additional holes in the structure.

14. The method according to claim 11, wherein the one or more retention features are located at a forward edge of the one or more interface members so that the one or more retention features are located at the bottom edge of the building-integrated photovoltaic device assembly and assist in holding down a bottom edge of each of the PV sheathing elements against forces of wind up-lift, and the one or more photovoltaic retention features connect to the PV sheathing elements without creating additional holes in the structure.

15. The method according to claim 1, wherein the one or more photovoltaic device retention features are an adhesive with a minimum peel force of about 5 pounds per linear inch measured using ASTM D 903-98 at a temperature between about −40° C. and about 85° C.

16. The method according to claim 1, wherein the one or more photovoltaic device retention features are an adhesive that has an elongation of about 500% or greater when measured using ASTM D 421-06, and the adhesive has a thickness after assembly from about 0.7 mm to about 2.0 mm.

* * * * *